United States Patent
Yamane

(10) Patent No.: US 7,626,432 B2
(45) Date of Patent: Dec. 1, 2009

(54) DLL CIRCUIT

(75) Inventor: Fumiyuki Yamane, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/053,937

(22) Filed: Mar. 24, 2008

(65) Prior Publication Data
US 2008/0252343 A1    Oct. 16, 2008

(30) Foreign Application Priority Data
Apr. 13, 2007    (JP) .............................. 2007-105993

(51) Int. Cl.
*H03L 7/06*    (2006.01)
(52) U.S. Cl. ........................ 327/158; 327/149
(58) Field of Classification Search .................. None
See application file for complete search history.

(56) References Cited

U.S. PATENT DOCUMENTS

| | | | | |
|---|---|---|---|---|
| 6,229,363 | B1 * | 5/2001 | Eto et al. ..................... | 327/158 |
| 6,255,870 | B1 * | 7/2001 | Na ............................... | 327/149 |
| 6,351,169 | B2 * | 2/2002 | Kuge ............................ | 327/161 |
| 6,573,776 | B2 * | 6/2003 | Miyamoto .................. | 327/276 |
| 7,327,175 | B2 * | 2/2008 | Lee ............................. | 327/158 |
| 7,436,230 | B2 * | 10/2008 | Kim ............................ | 327/158 |
| 2003/0076143 | A1 * | 4/2003 | Nishimura et al. .......... | 327/158 |
| 2005/0242854 | A1 * | 11/2005 | Kang et al. .................. | 327/158 |

FOREIGN PATENT DOCUMENTS

JP    2004-260663    9/2004

* cited by examiner

*Primary Examiner*—Cassandra Cox
(74) *Attorney, Agent, or Firm*—Oblon, Spivak, McClelland, Maier & Neustadt, L.L.P.

(57) ABSTRACT

A DLL circuit has an input circuit configured to generate a synchronization reference signal on the basis of an input signal, a first delay unit configured to delay the synchronization reference signal, a timing offset circuit configured to adjust a synchronization position of the synchronization reference signal delayed by the first delay unit to generate a signal to be synchronized, a phase comparison circuit configured to compare phase of the synchronization reference signal with that of the signal to be synchronized, a first control circuit configured to select an output signal of the first delay unit on the basis of a comparison result of the phase comparison circuit, a second delay unit configured to delay the synchronization reference signal or the signal to be synchronized and a second control circuit configured to select an output signal of the second delay unit in the case where the comparison result of the phase comparison circuit is within a predetermined range. The phase comparison circuit compares the phase of the signal, which is either the synchronization reference signal or the signal to be synchronized, delayed by the second delay unit with the phase of the other signal.

13 Claims, 8 Drawing Sheets

DLL CIRCUIT

CROSS-REFERENCE TO RELATED APPLICATION

This application is based upon and claims the benefit of priority from the prior Japanese Patent Application No. 2007-105993, filed on Apr. 13, 2007; the entire contents of which are incorporated herein by reference.

BACKGROUND OF THE INVENTION

The present invention relates to a DLL (Delay Locked Loop) circuit and, more particularly, to a DLL circuit having the function of reducing intensity of electromagnetic radiation noise.

An LSI mounted on an electronic device emits electromagnetic waves based on power consumption and operation frequency. Electromagnetic waves exert an adverse influence such as electromagnetic radiation noise on an entire electronic device. The main cause of the electromagnetic radiation noise is electromagnetic waves generated from a DLL (Delay Locked Loop) circuit provided for the LSI and other circuits using an output signal (DLL output signal) of the DLL circuit. In particular, strong electromagnetic waves are generated from the other circuits using the DLL output signal.

On the other hand, as electronic devices are sophisticated and the integration technique has improved in recent years, the power consumption, operation frequency, packaging density, and the number of LSIs mounted on an electronic device have been increasing. As a result, the intensity of electromagnetic waves (electromagnetic radiation intensity) emitted from the LSI increases, and the influence of electromagnetic radiation noise exerted on the electronic device is becoming unignorable.

A ordinary LSI has a DLL circuit. When the DLL circuit is in a locked state (that is, the DLL circuit and the LSI having the DLL circuit are in an operating state), the frequency of a DLL output signal of the DLL circuit has a constant value (DLL locked frequency). As a result, the electromagnetic radiation intensity at the DLL lock frequency becomes very high.

A DLL circuit suppressing minimum delay time (minimum slew rate) of delay time which can be adjusted in a wide range is known (Japanese Patent Application Laid-open Publication No. 2004-260663). However, the Japanese Patent Application Laid-open Publication No. 2004-260663 does not disclose means for reducing the electromagnetic radiation noise caused by the DLL circuit.

Therefore, the electromagnetic radiation intensity of the conventional DLL circuit and that of an LSI having the DLL circuit is high. There is a problem such that an electronic device having the LSI is adversely influenced by the electromagnetic radiation noise.

SUMMARY OF THE INVENTION

According to the first aspect of the present invention, there is provided a DLL circuit comprising:

an input circuit configured to generate a synchronization reference signal on the basis of an input signal;

a first delay unit configured to delay the synchronization reference signal;

a timing offset circuit configured to adjust a synchronization position of the synchronization reference signal delayed by the first delay unit to generate a signal to be synchronized;

a phase comparison circuit configured to compare phase of the synchronization reference signal with that of the signal to be synchronized;

a first control circuit configured to select an output signal of the first delay unit on the basis of a comparison result of the phase comparison circuit;

a second delay unit configured to delay the synchronization reference signal or the signal to be synchronized; and a second control circuit configured to select an output signal of the second delay unit in the case where the comparison result of the phase comparison circuit is within a predetermined range, wherein the phase comparison circuit compares the phase of the signal, which is either the synchronization reference signal or the signal to be synchronized, delayed by the second delay unit with the phase of the other signal.

According to the second aspect of the present invention, there is provided a DLL circuit comprising:

an input circuit configured to generate a synchronization reference signal on the basis of an input signal;

a first delay unit configured to delay the synchronization reference signal;

a timing offset circuit configured to adjust a synchronization position of the synchronization reference signal delayed by the first delay unit to generate a signal to be synchronized;

a phase comparison circuit configured to compare phase of the synchronization reference signal with that of the signal to be synchronized;

a first control circuit configured to select an output signal of the first delay unit on the basis of a comparison result of the phase comparison circuit and generating a cycle counter enable signal;

a second delay unit configured to delay the synchronization reference signal or the signal to be synchronized; and a second control circuit having a cycle counter configured to start counting cycles in response to the cycle counter enable signal generated by the first control circuit and selecting an output signal of the second delay unit in the case where the comparison result of the phase comparison circuit is within a predetermined range, wherein the phase comparison circuit compares phase of the signal, which is either the synchronization reference signal or the signal to be synchronized, delayed by the second delay unit with that of the other signal.

According to the third aspect of the present invention, there is provided a DLL circuit comprising:

an input circuit configured to generate a synchronization reference signal on the basis of an input signal;

a first delay unit configured to delay the synchronization reference signal generated by the input circuit;

a timing offset circuit configured to adjust a synchronization position of the synchronization reference signal delayed by the first delay unit to generate a signal to be synchronized;

a phase comparison circuit configured to compare phase of the synchronization reference signal generated by the input circuit with that of the signal to be synchronized which is generated by the timing offset circuit;

a first control unit configured to select an output signal of the first delay unit on the basis of a comparison result of the phase comparison circuit; and a second delay unit configured to delay the output signal selected by the first control unit in the case where the comparison result of the phase comparison circuit is within a predetermined range.

DETAILED DESCRIPTION

Embodiments of the present invention will be described hereinbelow with reference to the drawings. The following embodiments are aspects of the present invention and do not limit the scope of the invention.

EMBODIMENT 1

A first embodiment of the present invention will be described first.

Figure 1:
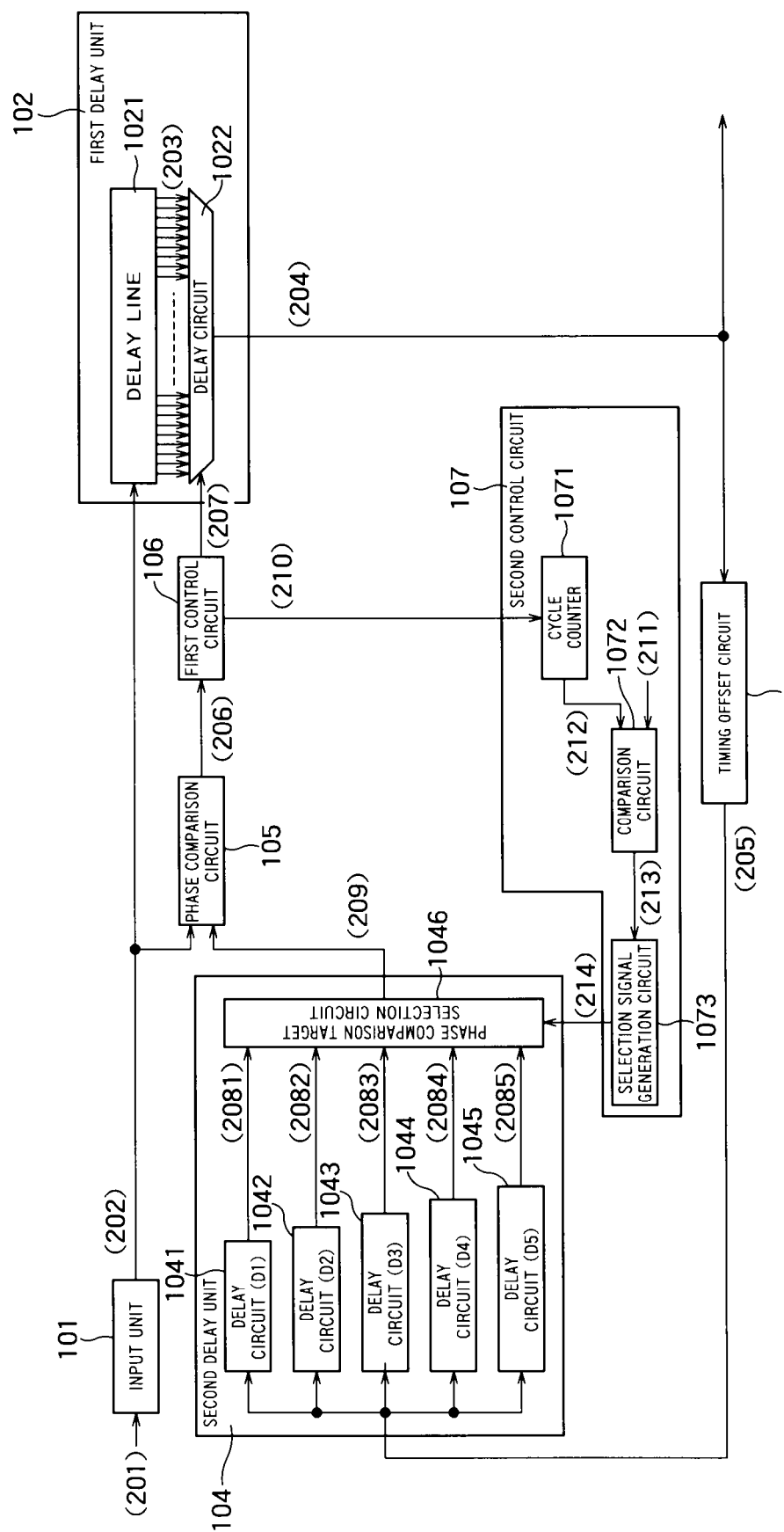
FIG. 1 is a circuit diagram showing the configuration of a DLL circuit of the first embodiment of the invention.

FIG. 1 is a circuit diagram showing the configuration of a DLL circuit of the first embodiment of the invention.

The DLL circuit of the first embodiment of the present invention has an input circuit 101, a first delay unit 102, a timing offset circuit 103, a second delay unit 104, a phase comparison circuit 105, a first control circuit 106, and a second control circuit 107.

The input circuit 101 generates a "synchronization reference signal (202)" as a reference of synchronization from a DLL input signal (201) and outputs the synchronization reference signal (202) to the first delay unit 102 and the phase comparison circuit 105.

The first delay unit 102 is constructed by a delay line 1021 and a selection circuit 1022. The delay line 1021 and the selection circuit 1022 are serially connected via a plurality of signal lines.

The delay line 1021 receives the "synchronization reference signal (202)" output from the input circuit 101, and delays the signal only by predetermined delay time, thereby generating a "delayed synchronization reference signal (203)".

The selection circuit 1022 selects a "DLL output signal (204)" from the "delayed synchronization reference signals (203)" output from the delay line 1021 in accordance with a "control signal (207)" output from the first control circuit 106 which will be described later, and outputs it to the timing offset circuit 103 or to an external circuit (not shown) connected to the DLL circuit.

The timing offset circuit 103 receives the "DLL output signal (204)" output from the selection circuit 1022, adjusts a synchronization position, thereby generating a "signal (205) to be synchronized", and outputs the signal (205) to the second delay unit 104.

The second delay unit 104 is constructed by five delay circuits 1041 to 1045 and a phase comparison target selection circuit 1046. The delay circuits 1041 to 1045 have different delay times (D1 to D5), respectively. For example, in the case where the operation frequency of a processor mounted on the LSI is 1 GHz, D1=20 ps, D2=40 ps, D3=60 ps, D4=80 ps, and D5=100 ps. A circuit (the delay circuit 1043 in the example) having average delay time (D3=60 ps in the example) of the delay circuits 1041 to 1045 is set as a standard delay circuit. The number of the delay circuits 1041 to 1045 may be two or more.

The delay circuits 1041 to 1045 receive the "signal (205) to be synchronized" output from the timing offset circuit 103, delay the signal only by predetermined delay times (D1 to D5), thereby generating "delayed synchronization target signals (2081 to 2085)", and output the signals (2081 to 2085) to the phase comparison target selection circuit 1046.

The phase comparison target selection circuit 1046 selects a "selection delay synchronization target signal (209)" as an output signal of the second delay unit 104 from the "delayed synchronization target signals (2081 to 2085)" output from the delay circuits 1041 to 1045 in accordance with a "selection signal (214)" output from a selection signal generation circuit 1073 which will be described later, and outputs the selected signal to the phase comparison circuit 105. When the DLL circuit is not in the locked state, the phase comparison target selection circuit 1046 always selects the "delayed synchronization target signal (2083)" output from the standard delay circuit (for example, the delay circuit 1043).

The phase comparison circuit 105 receives the "synchronization reference signal (202)" output from the input circuit 101 and the "selection delay synchronization target signal (209)" output from the phase comparison target selection circuit 1046, compares the phases of both signals, and outputs a "comparison result (206)" to the first control circuit 106.

The first control circuit 106 receives the "comparison result (206)" output from the phase comparison circuit 105, generates the "control signal (207)" for controlling the selection circuit 1022 in accordance with the "comparison result (206)", and outputs the "control signal (207)" to the selection circuit 1022. The first control circuit 106 also generates a "cycle counter enable signal (210)" for setting a cycle counter 1071 which will be described later into an enable state in accordance with the "comparison result (206)", and outputs the signal to the cycle counter 1071. When the "cycle counter enable signal (210)" is generated by the first control circuit 106, the DLL circuit enters a so-called "locked state".

The second control circuit 107 is constructed by the cycle counter 1071, a comparison circuit 1072, and a selection signal generating circuit 1073.

The cycle counter 1071 starts counting the number of cycles in response to the "cycle counter enable signal (210)" output from the first control circuit 106, and outputs a "cycle count value (212)" to the comparison circuit 1072. The cycle counter 1071 resets the cycle count value when the "comparison result (212)" of the comparison circuit 1072 which will be described later indicates a "match".

The comparison circuit 1072 compares the "cycle count value (212)" output from the cycle counter 1071 with a predetermined "delay circuit switching cycle set value (211)" and outputs a "comparison result (213)" to the selection signal generating circuit 1073.

The selection signal generating circuit 1073 generates a "selection signal (214)" for controlling the phase comparison target selection circuit 1046 in accordance with the "comparison result (213)" output from the comparison circuit 1072, and outputs the "selection signal (214)" to the phase comparison target selection circuit 1046. The selection signal generating circuit 1073 generates the "selection signal (214)" so as to select the "delayed synchronization target signal (2083)" output from a delay circuit having the longest delay time next to that of the delay circuit selected just before (for example, the delay circuit 1044 in the case where the delay circuit 1043 is selected just before). The selection signal generating circuit 1073 may generate the "selection signal (214)" so as to select a "delay synchronization target signal" output from a delay circuit having the shortest delay time next to that of a delay circuit selected just before. In the case where the delay circuit selected just before is a delay circuit having the shortest delay time (or the longest delay time), the selection signal generating circuit 1073 may generate the "selection signal (214)" so as to select a "delay synchronization target signal" output from the delay circuit having the longest delay time (or the shortest delay time).

Figure 2:
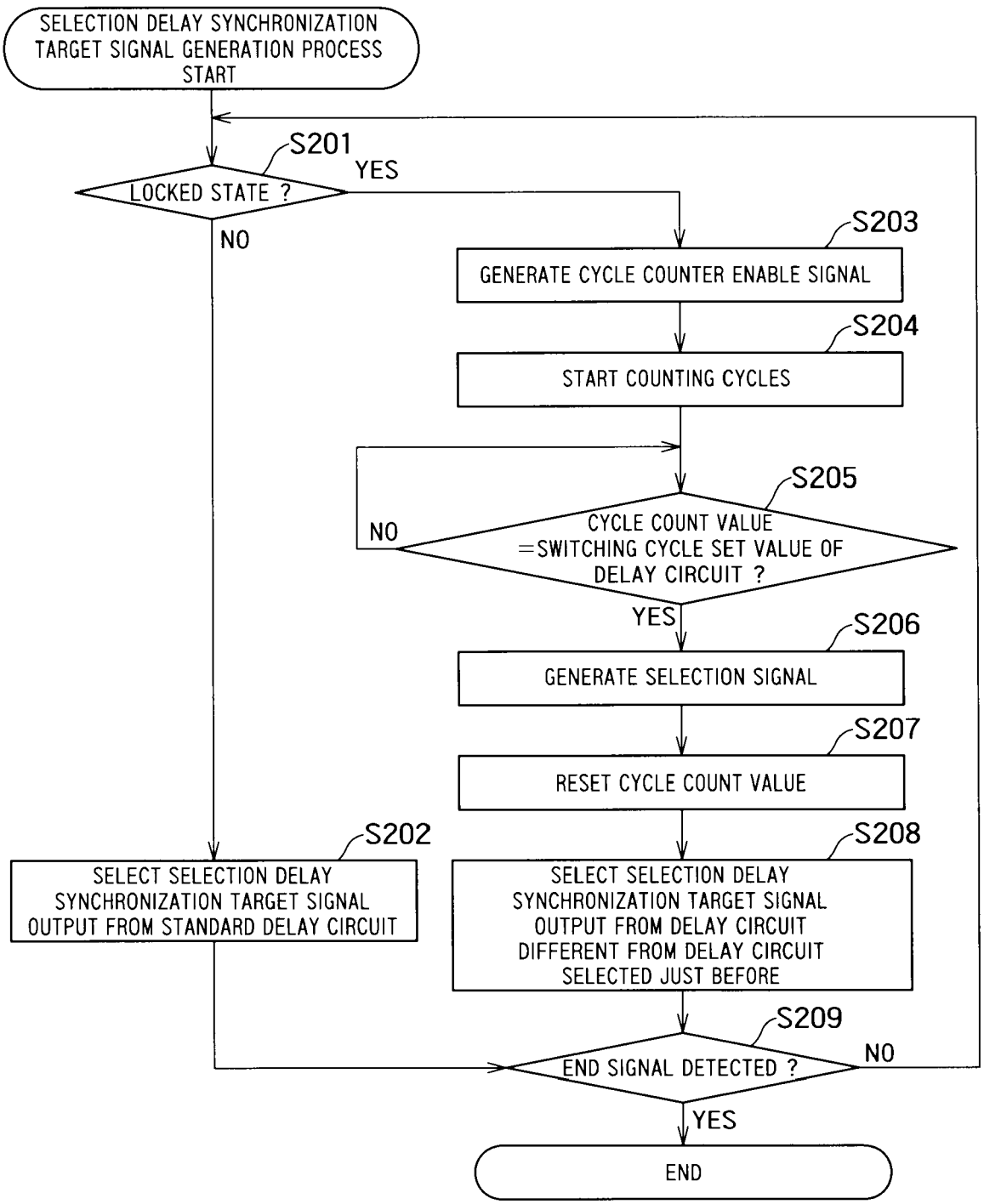
FIG. 2 is a flowchart showing the procedure of the DLL circuit in the selection delay synchronization target signal generation process of the first embodiment of the present invention.

FIG. 2 is a flowchart showing the procedure of the DLL circuit in the selection delay synchronization target signal generation process of the first embodiment of the present invention.

First, when the DLL circuit is not in the locked state (S201-NO), the phase comparison target selection circuit 1046 selects the selection delay synchronization target signal (for example, the "selection delay synchronization target signal (2083)") output from the standard delay circuit (for example, the delay circuit 1043) (S202).

On the other hand, when the DLL circuit is in the locked state (S201-YES), the first control circuit 106 generates the "cycle counter enable signal (210)" (S203).

Next, the cycle counter 107 starts counting the cycles (S204).

Next, in the case where the "comparison result (213)" output from the comparison circuit 1072 shows a match (S205-YES), the selection signal generation circuit 1073 generates the "selection signal (214)" (S206).

Next, the cycle counter 107 resets the cycle count value (S207).

Next, the phase comparison target selection circuit 1046 selects the selection delay synchronization target signal output from a delay circuit different from the delay circuit selected just before (for example, a delay circuit having the longest delay time next to that of the delay circuit selected just before) (S208).

The steps S201 to S208 are repeated until an end signal is detected (S209-NO). On the other hand, when the end signal is detected after the step S202 or S208 (S209-YES), the selection delay synchronization target signal generation process of the first embodiment of the present invention is finished. The end signal is detected in the case where the LSI shifts to a sleep state, is reset, or shifts to a power saving mode. In the power saving mode, the DLL circuit of the first embodiment of the present invention stops the operation of the timing offset circuit 103, the second delay unit 104, the phase comparison circuit 105, and the second control circuit 107. The first delay unit 102 outputs the "DLL output signal (204)" at a predetermined frequency.

According to the first embodiment of the present invention, in the case where the DLL circuit is in the locked state and the LSI is in the operating state, the phase comparison target selection circuit 1046 selects the "selection delay synchronization target signal (209)" so that the frequency of the "DLL output signal (204)" changes in predetermined cycles. Consequently, the electromagnetic radiation intensity of the LSI can be reduced and, moreover, the influence on an electronic device of the electromagnetic radiation noise can be reduced.

EMBODIMENT 2

A second embodiment of the present invention will now be described with reference to the drawings. In the first embodiment of the present invention, an example of delaying a signal to be synchronized has been described. In the second embodiment of the invention, an example of delaying a synchronization reference signal will be described. The description similar to that of the first embodiment of the present invention will not be repeated.

Figure 3:
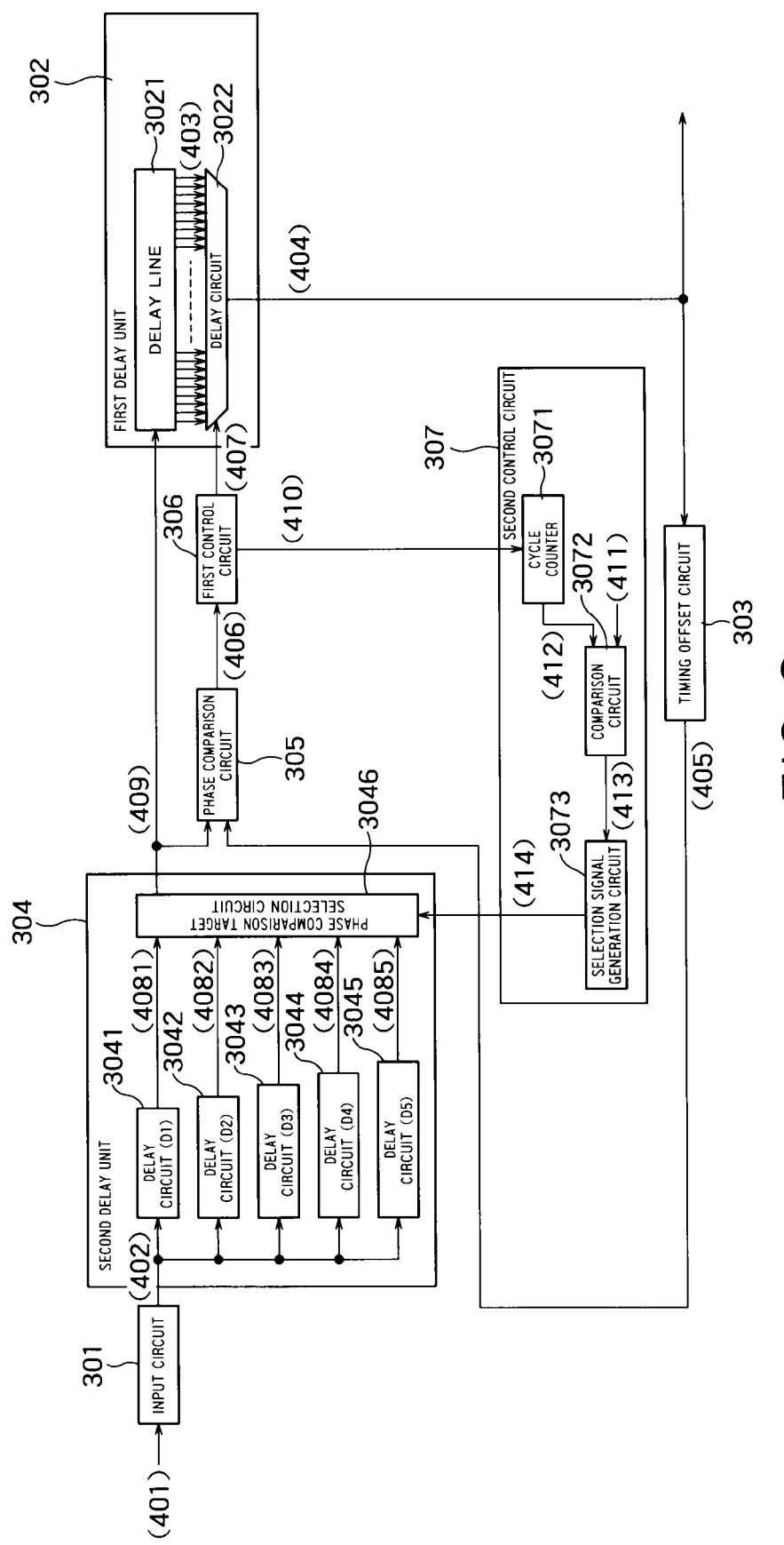
FIG. 3 is a circuit diagram showing the configuration of a DLL circuit of the second embodiment of the present invention.

FIG. 3 is a circuit diagram showing the configuration of a DLL circuit of the second embodiment of the present invention.

The DLL circuit of the second embodiment of the present invention has an input circuit 301, a first delay unit 302, a timing offset circuit 303, a second delay unit 304, a phase comparison circuit 305, a first control circuit 306, and a second control circuit 307.

The input circuit 301 generates a "synchronization reference signal (402)" as synchronization reference from a DLL input signal (401) and outputs it to the second delay unit 304.

The first delay unit 302 is constructed by a delay line 3021 and a selection circuit 3022. The delay line 3021 and the selection circuit 3022 are connected in serial via a plurality of signal lines.

The delay line 3021 receives a "selected delay synchronization reference signal (409)" output from the second delay unit 304 which will be described later and delays the signal only by predetermined delay time to generate a "delayed synchronization reference signal (403)".

The selection circuit 3022 selects a "DLL output signal (404)" from the "delayed synchronization reference signals (403)" output from the delay line 3021 in accordance with a "control signal (407)" output from the first control circuit 306 which will be described later, and outputs it to the timing offset circuit 303 or to an external circuit (not shown) connected to the DLL circuit.

The timing offset circuit 303 receives the "DLL output signal (404)" output from the selection circuit 3022, adjusts the synchronization position to generate a "signal (405) to be synchronized", and outputs the signal (405) to the phase comparison circuit 305.

The second delay unit 304 is constructed by five delay circuits 3041 to 3045 and a phase comparison target selection circuit 3046. The delay circuits 3041 to 3045 have different delay times (D1 to D5), respectively. For example, in the case where the operation frequency of a processor mounted on the LSI is 1 GHz, D1=20 ps, D2=40 ps, D3=60 ps, D4=80 ps, and D5=100 ps. A circuit (the delay circuit 3043 in the example) having average delay time (D3=60 ps in the example) of the delay circuits 3041 to 3045 is set as a standard delay circuit. The number of the delay circuits 3041 to 3045 is two or more.

The delay circuits 3041 to 3045 receive a "synchronization reference signal (402)" output from the input circuit 301, delay the signal only by predetermined delay times (D1 to D5), thereby generating "delayed synchronization reference signals (4081 to 4085)", and output the signals (4081 to 4085) to the phase comparison target selection circuit 3046.

The phase comparison target selection circuit 3046 selects a "selection delay synchronization target signal (409)" as an output signal of the second delay unit 304 from the "delayed synchronization reference signals (4081 to 4085)" output from the delay circuits 3041 to 3045 in accordance with a "selection signal (414)" output from a selection signal generating circuit 3073 which will be described later, and outputs the selected signal to the phase comparison circuit 305. When the DLL circuit is not in the locked state, the phase comparison target selection circuit 3046 always selects the "delay synchronization reference signal (4083)" output from the standard delay circuit (for example, the delay circuit 3043).

The phase comparison circuit 305 receives a "signal (405) to be synchronized" output from the timing offset circuit 303 and the "selection delay synchronization reference signal (409)" output from the phase comparison target selection circuit 3046, compares the phases of both signals, and outputs a "comparison result (406)" to the first control circuit 306.

The first control circuit 306 and the second control circuit 307 are similar to the first control circuit 106 and the second control circuit 107 of the first embodiment of the present invention, respectively.

Figure 4:
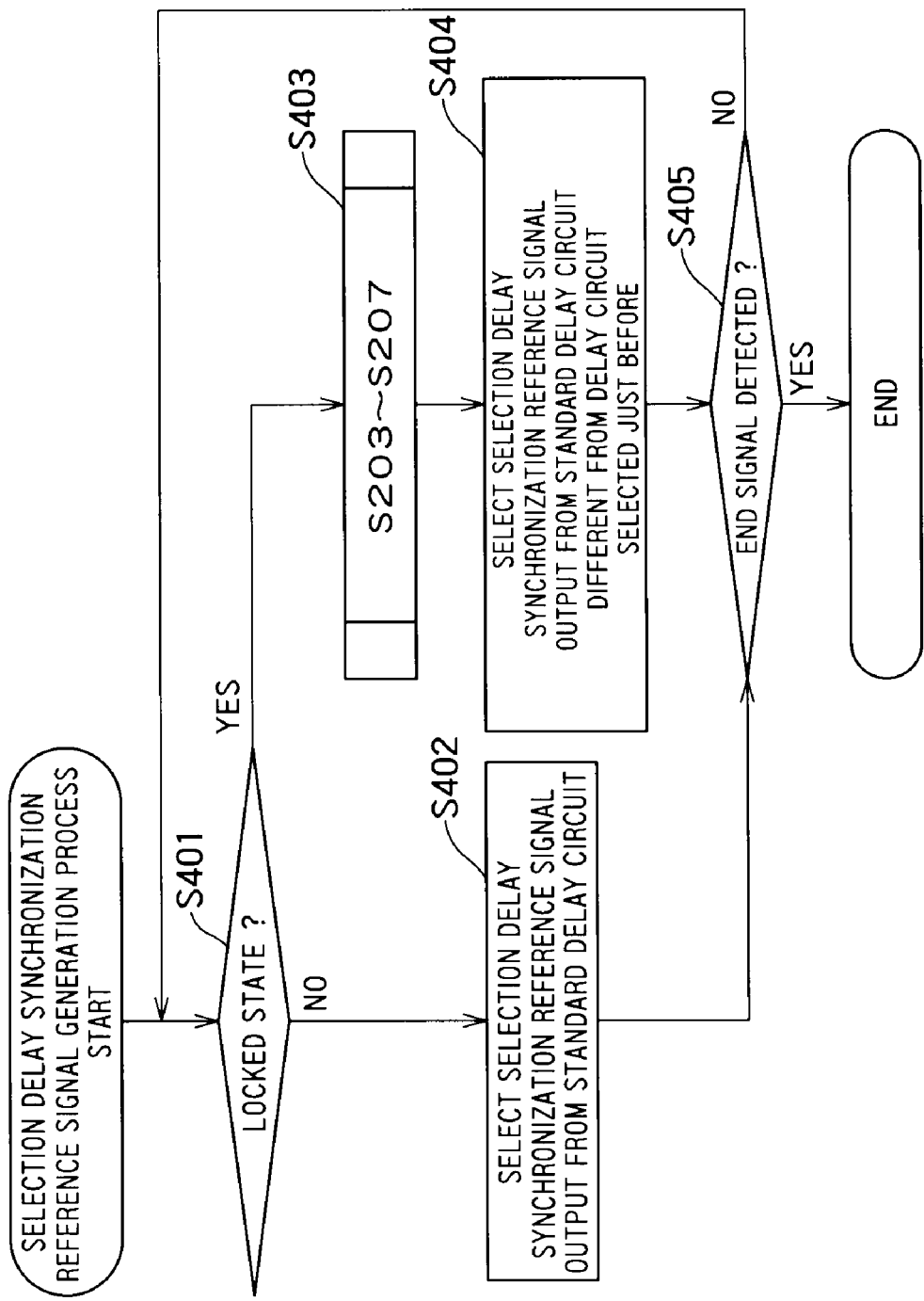
FIG. 4 is a flowchart showing the procedure of the DLL circuit in the selection delay synchronization reference signal generation process in the second embodiment of the invention.

FIG. 4 is a flowchart showing the procedure of the DLL circuit in the selection delay synchronization reference signal generation process in the second embodiment of the invention.

First, when the DLL circuit is not in the locked state (S401-NO), the phase comparison target selection circuit 3046 selects the selection delay synchronization reference signal (for example, the "selection delay synchronization reference signal (4083)") output from the standard delay circuit (for example, the delay circuit 3043) (S402).

On the other hand, when the DLL circuit is in the locked state (S401-YES), processes similar to S203 to S207 in FIG. 2 are performed (S403).

Next, the phase comparison target selection circuit 3046 selects the selection delay synchronization reference signal output from a delay circuit different from the delay circuit selected just before (for example, a delay circuit having the longest delay time next to that of the delay circuit selected just before) (S404).

The steps S401 to S404 are repeated until an end signal is detected (S405-NO). On the other hand, when the end signal is detected after the step S402 or S404 (S405-YES), the selection delay synchronization reference signal generation process of the second embodiment of the present invention is finished.

According to the second embodiment of the present invention, in the case where the DLL circuit is in the locked state and the LSI is in the operating state, the phase comparison target selection circuit 3046 selects the "selection delay synchronization reference signal (409)" so that the frequency of the "DLL output signal (404)" changes in predetermined cycles. Consequently, the electromagnetic radiation intensity of the LSI can be reduced and, moreover, the influence on an electronic device of the electromagnetic radiation noise can be reduced.

EMBODIMENT 3

A third embodiment of the present invention will now be described with reference to the drawings. In the first embodiment of the present invention, an example of delaying a signal to be synchronized has been described. In the third embodiment of the invention, an example of delaying a DLL output signal will be described. The description similar to that of the first and second embodiments of the present invention will not be repeated.

Figure 5:
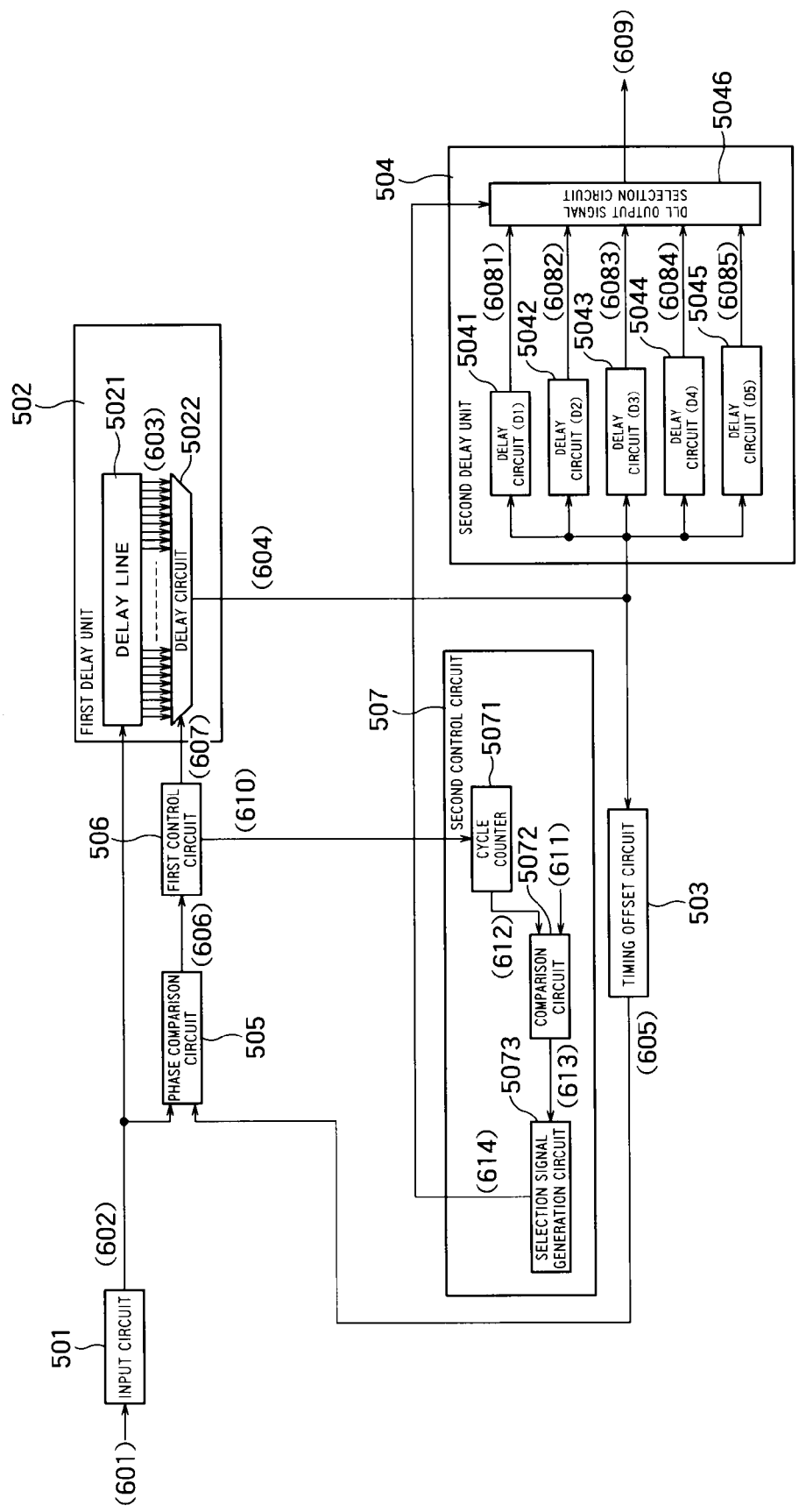
FIG. 5 is a circuit diagram showing the configuration of a DLL circuit of the third embodiment of the present invention.

FIG. 5 is a circuit diagram showing the configuration of a DLL circuit of the third embodiment of the present invention.

The DLL circuit of the third embodiment of the present invention has an input circuit 501, a first delay unit 502, a timing offset circuit 503, a second delay unit 504, a phase comparison circuit 505, a first control circuit 506, and a second control circuit 507.

A selection circuit 5022 in the first delay unit 502 selects a "DLL output signal (604)" from "delayed synchronization reference signal (603)" output from a delay line 5021 in accordance with a "control signal (607)" output from the first control circuit 506 which will be described later, and outputs it to the timing offset circuit 503 or the second delay unit 504.

The timing offset circuit 503 receives the "DLL output signal (604)" output from the selection circuit 5022, adjusts the synchronization position to generate a "signal (605) to be synchronized", and outputs the resultant signal to the phase comparator 505.

The second delay unit 504 is constructed by five delay circuits 5041 to 5045 and a DLL output selection circuit 5046. The delay circuits 5041 to 5045 have different delay times (D1 to D5), respectively. For example, in the case where the operation frequency of a processor mounted on the LSI is 1 GHz, D1=20 ps, D2=40 ps, D3=60 ps, D4=80 ps, and D5=100 ps. A circuit (the delay circuit 5043 in the example) having average delay time (D3=60 ps in the example) of the delay circuits 5041 to 5045 is set as a standard delay circuit. The number of the delay circuits 5041 to 5045 may be two or more.

The delay circuits 5041 to 5045 receive the "DLL output signal (604)" output from the selection circuit 5022, delay the signal only by predetermined delay times (D1 to D5), thereby generating "delayed DLL output signals (6081 to 6085)", and output the signals (6081 to 6085) to the DLL output signal selection circuit 5046.

The DLL output signal selection circuit 5046 selects a "selection delay DLL output signal (609)" as an output signal of the DLL circuit from the "delayed DLL output signals (6081 to 6085)" output from the delay circuits 5041 to 5045 in accordance with a "selection signal (614)" output from a selection signal generating circuit 5073 which will be described later. The DLL output signal selection circuit 5046 outputs the selected signal to an external circuit (not shown) connected to the DLL circuit. When the DLL circuit is not in the locked state, the DLL output signal selection circuit 5046 always selects the "delayed DLL output signal (6083)" output from the standard delay circuit (for example, the delay circuit 5043).

The phase comparison circuit 505 receives a "synchronization reference signal (602)" output from the input circuit 501 and the "synchronization target signal (605)" output from the timing offset circuit 503, compares the phases of the signals, and outputs a "comparison result (606)" to the first control circuit 506.

The input circuit 501, the delay line 5021 in the first delay unit 502, the first control circuit 506, and the second control circuit 507 are similar to the input circuit 101, the delay line 1021 in the first delay unit 102, the first control circuit 106, and the second control circuit 107 of the first embodiment of the present invention, respectively.

Figure 6:
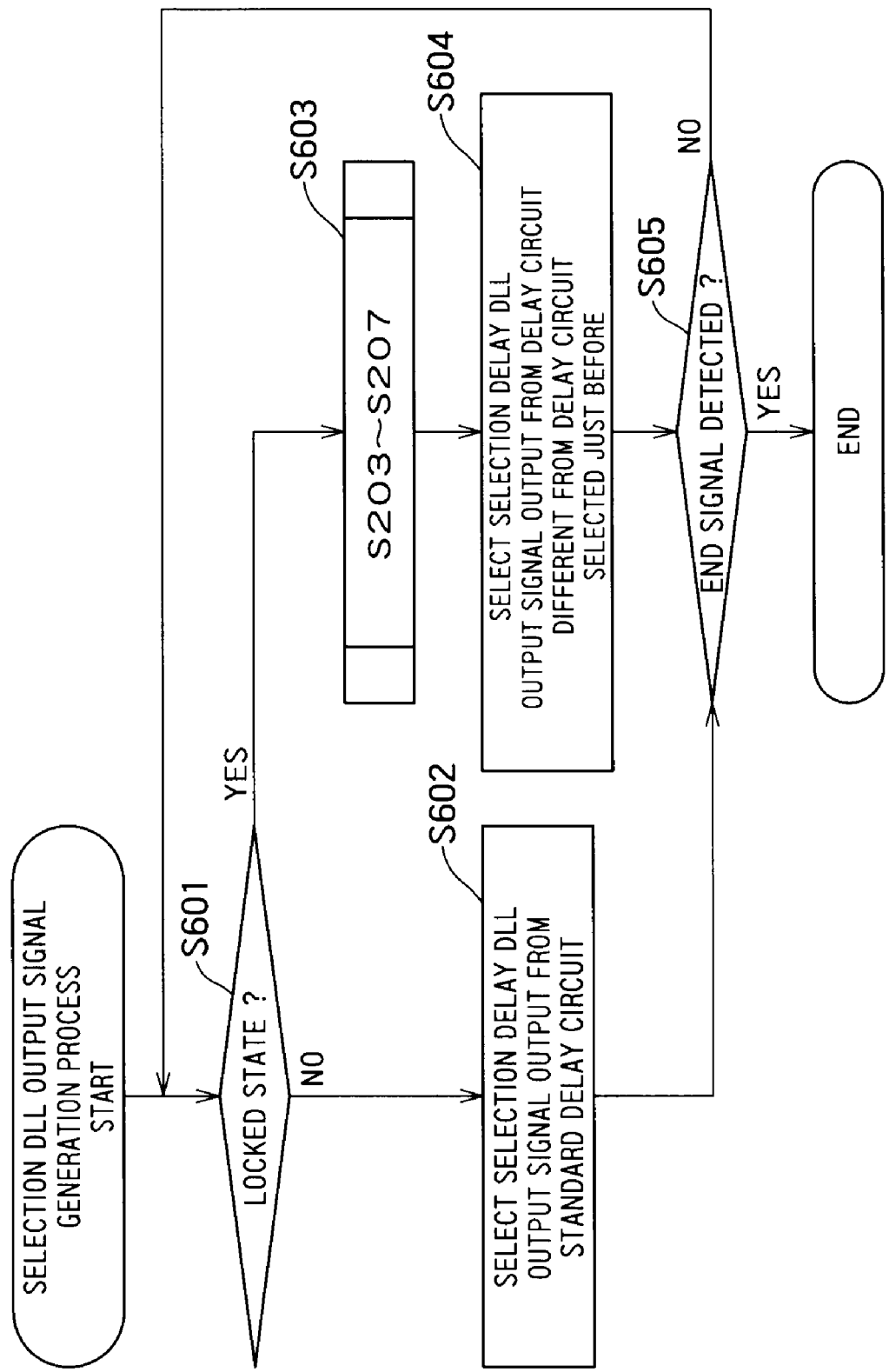
FIG. 6 is a flowchart showing the procedure of the DLL circuit in the selection delay DLL output signal generation process in the third embodiment of the present invention.

FIG. 6 is a flowchart showing the procedure of the DLL circuit in the selection delay DLL output signal generation process in the third embodiment of the present invention.

First, when the DLL circuit is not in the locked state (S601-NO), the DLL output signal selection circuit 5046 selects the selection delay DLL output signal (for example, the "selection delay DLL output signal (5083)") output from the standard delay circuit (for example, the delay circuit 5043) (S602).

On the other hand, when the DLL circuit is in the locked state (S601-YES), processes similar to S203 to S207 in FIG. 2 are performed (S603).

Next, the DLL output signal selection circuit 5046 selects the selection delay DLL output signal output from a delay circuit different from the delay circuit selected just before (for example, a delay circuit having the longest delay time next to that of the delay circuit selected just before) (S604).

The steps S601 to S604 are repeated until an end signal is detected (S605-NO). On the other hand, when the end signal is detected after the step S602 or S604 (S605-YES), the selection delay DLL output signal generation process of the third embodiment of the present invention is finished.

According to the third embodiment of the present invention, in the case where the DLL circuit is in the locked state and the LSI is in the operating state, the DLL output signal selection circuit 5046 selects the "delay DLL output signal (609)" so that the frequency of the "DLL output signal (604)" changes in predetermined cycles. Consequently, the electromagnetic radiation intensity of the LSI can be reduced and, moreover, the influence on an electronic device of the electromagnetic radiation noise can be reduced.

According to the third embodiment of the present invention, the second delay unit 504 is connected at the post stage of the first delay unit 502, so that the designing of the DLL circuit can be facilitated.

COMPARATIVE EXAMPLE

A comparative example of the present invention will now be described with reference to the drawing.

Figure 7:
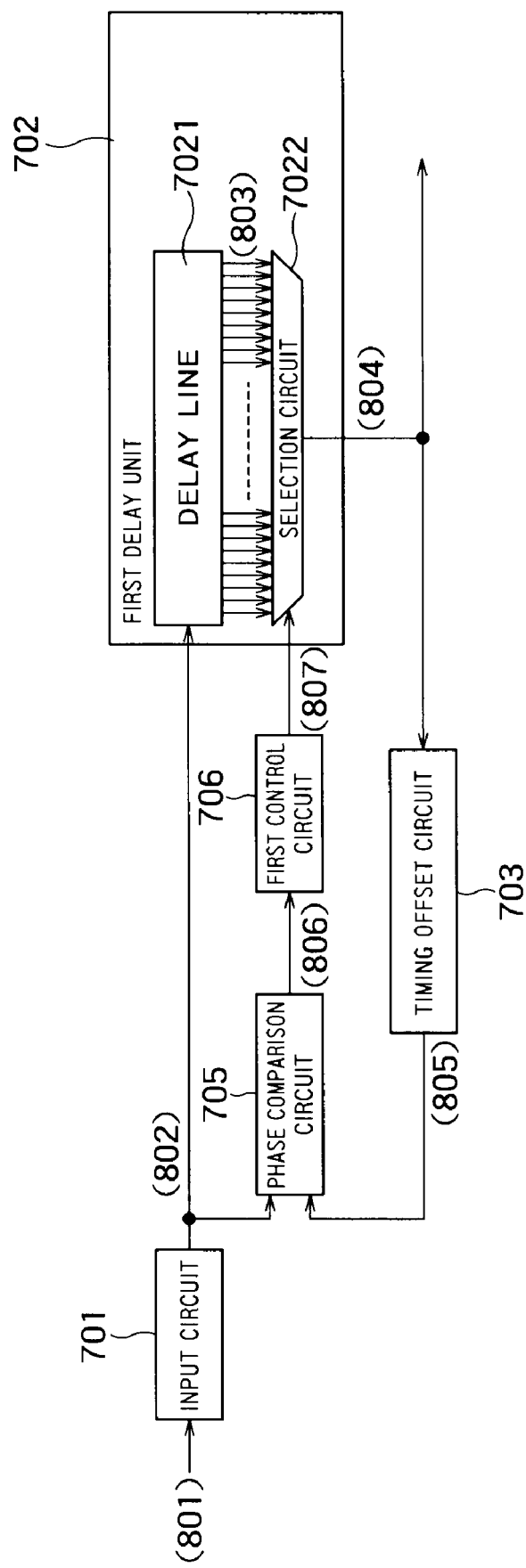
FIG. 7 is a circuit diagram showing the configuration of a DLL circuit of the comparative example of the present invention.

FIG. 7 is a circuit diagram showing the configuration of a DLL circuit of the comparative example of the present invention.

The DLL circuit of the comparison example of the invention has an input circuit 701, a first delay unit 702, a timing offset circuit 703, a phase comparison circuit 705, and a first control circuit 706.

The timing offset circuit 703 receives the "DLL output signal (804)" output from the selection circuit 7022, adjusts the synchronization position to generate a "signal (805) to be synchronized", and outputs the signal (805) to the phase comparator 705.

The phase comparison circuit 705 receives a "synchronization reference signal (802)" output from the input circuit 701 and the "signal (805) to be synchronized" output from the timing offset circuit 703, compares the phases of the signals, and outputs a "comparison result (806)" to the first control circuit 706.

The first control circuit 706 receives the "comparison result (806)" output from the phase comparison circuit 705, generates a "control signal (807)" for controlling the selection circuit 7022 in accordance with the "comparison result (806)", and outputs the control signal (807) to the selection circuit 7022.

The input circuit 701 and the first delay unit 702 are similar to the input circuit 101 and the first delay unit 102 of the first embodiment of the invention, respectively.

Figure 8:
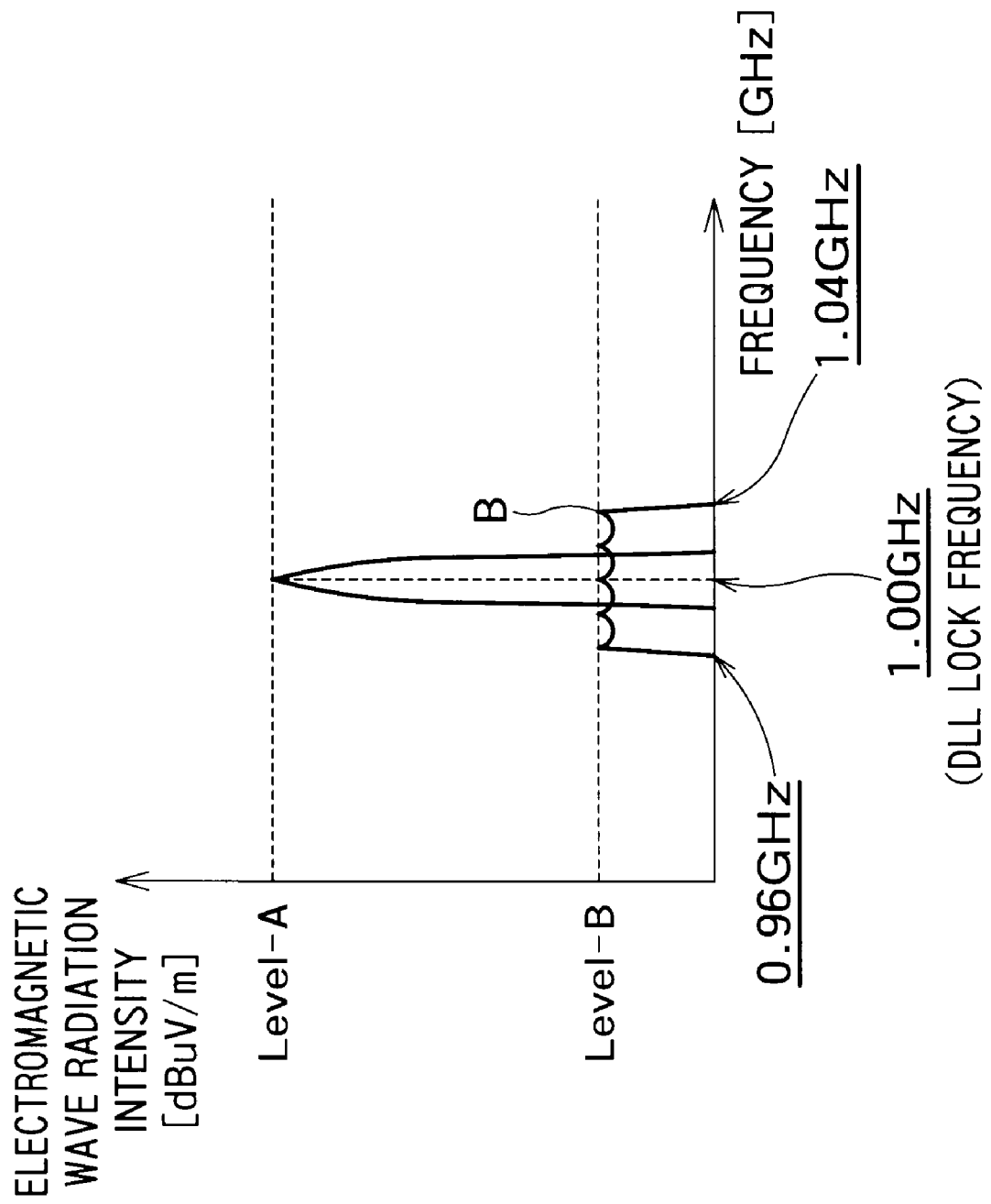
FIG. 8 is a graph showing an example of distributions of electromagnetic wave radiation intensities of an LSI having any of the DLL circuits of the first to third embodiments of the present invention and an LSI having the DLL circuit of the comparative example of the invention.

FIG. 8 is a graph showing an example of distributions of electromagnetic wave radiation intensities of an LSI having any of the DLL circuits of the first to third embodiments of the present invention and an LSI having the DLL circuit of the comparative example of the invention.

Reference character A in FIG. 8 shows an example of the distribution of the electromagnetic wave radiation intensity of the LSI having the DLL circuit of the comparative example of the invention. Reference character B in FIG. 8 shows an example of the distribution of the electromagnetic wave radiation intensity of the LSI having any of the DLL circuits of the first to third embodiments of the invention.

In the DLL circuit of the comparative example of the invention, in the case where the DLL circuit is in the locked state and the LSI is in the operating sate, the frequency (DLL lock frequency) of the "DLL output signal (804)" is constant. Therefore, the maximum value of the electromagnetic wave radiation intensity is large (Level-A) and the width of the DLL lock frequency is narrow (refer to A in FIG. 8). As shown by the reference character A in FIG. 8, in the DLL circuit of the comparative example of the present invention, the electromagnetic wave radiation intensity at a specific frequency is strong.

On the other hand, in any of the DLL circuits of the first to third embodiments of the present invention, in the case where the DLL circuit is in the locked state and the LSI is in the operating state, a process is performed so that the frequency of a "DLL output signal" swings in predetermined cycles. Consequently, the maximum value of the electromagnetic wave radiation intensity is smaller than that in the comparative example of the invention (Level-B) and the width of the DLL lock frequency increases (refer to B in FIG. 8).

As shown by the reference character B in FIG. 8, in any of the DLL circuits of the first to third embodiments of the present invention, the frequency band indicative of the maximum value of the electromagnetic wave radiation intensity is wider, and the maximum value is smaller.

From the above, it is understood that the electromagnetic wave radiation intensity of any of the DLL circuits in the first to third embodiments of the present invention is lower than that in the DLL circuit in the comparative example of the present invention.

What is claimed is:

1. A DLL circuit comprising:
   an input circuit configured to generate a synchronization reference signal on the basis of an input signal;
   a first delay unit configured to delay the synchronization reference signal;
   a timing offset circuit configured to adjust a synchronization position of the synchronization reference signal delayed by the first delay unit to generate a signal to be synchronized;
   a phase comparison circuit configured to compare phase of the synchronization reference signal with that of the signal to be synchronized;
   a first control circuit configured to select an output signal of the first delay unit on the basis of a comparison result of the phase comparison circuit;
   a second delay unit configured to delay one of the synchronization reference signal or the signal to be synchronized; and
   a second control circuit configured to select an output signal of the second delay unit in the case where the comparison result of the phase comparison circuit is within a predetermined range,
   wherein the phase comparison circuit compares the phase of the one of the synchronization reference signal or the signal to be synchronized that is delayed by the second delay unit with the phase of the other of the synchronization reference signal or the signal to be synchronized not delayed by the second delay unit.

2. The DLL circuit according to claim 1, wherein the second delay unit delays the signal to be synchronized which is generated by the timing offset circuit, and the phase comparison circuit compares the phase of the synchronization reference signal generated by the input circuit with that of the signal to be synchronized which is delayed by the second delay unit.

3. The DLL circuit according to claim 1, wherein the second delay unit delays the synchronization reference signal generated by the input circuit, and the phase comparison circuit compares the phase of the synchronization reference signal delayed by the second delay unit with that of the signal to be synchronized which is generated by the timing offset circuit.

4. DLL circuit comprising:

an input circuit configured to generate a synchronization reference signal on the basis of an input signal;

a first delay unit configured to delay the synchronization reference signal;

a timing offset circuit configured to adjust a synchronization position of the synchronization reference signal delayed by the first delay unit to generate a signal to be synchronized;

a phase comparison circuit configured to compare phase of the synchronization reference signal with that of the signal to be synchronized;

a first control circuit configured to select an output signal of the first delay unit on the basis of a comparison result of the phase comparison circuit and generating a cycle counter enable signal;

a second delay unit configured to delay one of the synchronization reference signal or the signal to be synchronized; and a second control circuit having a cycle counter configured to start counting cycles in response to the cycle counter enable signal generated by the first control circuit and selecting an output signal of the second delay unit in the case where the comparison result of the phase comparison circuit is within a predetermined range, wherein the phase comparison circuit compares the phase of the one of the synchronization reference signal or the signal to be synchronized that is delayed by the second delay unit with the phase of the other of the synchronization reference signal or the signal to be synchronized not delayed by the second delay unit.

5. The DLL circuit according to claim 4, wherein the second control unit has a comparison circuit configured to compare a cycle count value of the cycle counter with a predetermined switching cycle set value.

6. The DLL circuit according to claim 5, wherein the second control circuit further comprises a selection signal generating circuit configured to generate a selection signal in the case where a comparison result of the comparison circuit shows a match, and the second delay unit further comprises a plurality of delay circuits having different delay times, and a phase comparison target selection circuit configured to select one of output signals of the plurality of delay circuits on the basis of the selection signal generated by the selection signal generating circuit.

7. The DLL circuit according to claim 6, wherein in the case where the selection signal is generated by the selection signal generating circuit, the phase comparison target selection circuit selects an output signal having delay time different from that of an output signal selected just before.

8. The DLL circuit according to claim 4, wherein the second delay unit delays a signal to be synchronized which is generated by the timing offset circuit, and the phase comparison circuit compares phase of a synchronization reference signal generated by the input circuit with phase of the signal to be synchronized which is delayed by the second delay unit.

9. The DLL circuit according to claim 4, wherein the second delay unit delays the synchronization reference signal generated by the input circuit, and the phase comparison circuit compares the phase of the synchronization reference signal delayed by the second delay unit with that of the signal to be synchronized which is generated by the timing offset circuit.

10. A DLL circuit comprising:

an input circuit configured to generate a synchronization reference signal on the basis of an input signal;

a first delay unit configured to delay the synchronization reference signal generated by the input circuit;

a timing offset circuit configured to adjust a synchronization position of the synchronization reference signal delayed by the first delay unit to generate a signal to be synchronized;

a phase comparison circuit configured to compare the phase of the synchronization reference signal generated by the input circuit with that of the signal to be synchronized which is generated by the timing offset circuit;

a first control unit configured to select an output signal of the first delay unit on the basis of a comparison result of the phase comparison circuit;

a second delay unit configured to delay the output signal selected by the first control unit in the case in which the comparison result of the phase comparison circuit is within a predetermined range; and a second control unit configured to select an output signal of the second delay unit in the case in which the comparison result of the phase comparison circuit is within a predetermined range, wherein the first control circuit generates a cycle counter enable signal, and the second control circuit has a cycle counter configured to start counting cycles in response to the cycle counter enable signal generated by the first control circuit.

11. The DLL circuit according to claim 10, wherein the second control unit has a comparison circuit configured to compare a cycle count value of the cycle counter with a predetermined switching cycle set value.

12. The DLL circuit according to claim 11, wherein the second control circuit further comprises a selection signal generating circuit configured to generate a selection signal in the case where the comparison result of the comparison circuit shows a match, and the second delay unit further comprises a plurality of delay circuits having different delay times, and a DLL output signal selection circuit configured to select one of output signals of the plurality of delay circuits on the basis of the selection signal generated by the selection signal generating circuit.

13. The DLL circuit according to claim 12, wherein when the selection signal is generated by the selection signal generating circuit, the DLL output signal selection circuit selects an output signal having delay time different from that of an output signal selected just before.

* * * * *